(12) United States Patent
DeSalvo et al.

(10) Patent No.: US 6,560,257 B1
(45) Date of Patent: May 6, 2003

(54) LOW POWER LASER DRIVER

(75) Inventors: John DeSalvo, Satellite Beach, FL (US); Michael Lange, Palm Bay, FL (US); Alan Williams, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 322 days.

(21) Appl. No.: 09/724,255

(22) Filed: Nov. 28, 2000

(51) Int. Cl.[7] .................................................. H01S 3/00
(52) U.S. Cl. ............................ 372/38.02; 372/29.015; 372/38.07; 372/38.1
(58) Field of Search ...................... 372/29.015, 38.1, 372/38.02, 38.07, 38.03, 69, 75

(56) References Cited

U.S. PATENT DOCUMENTS

| | | | | |
|---|---|---|---|---|
| 5,022,042 A | * | 6/1991 | Bradley | 372/75 |
| 5,666,045 A | * | 9/1997 | Grodevant | 323/282 |
| 5,675,432 A | | 10/1997 | Kosaka | 359/341 |
| 5,701,194 A | | 12/1997 | Meli et al. | 359/341 |
| 5,745,283 A | | 4/1998 | Inagaki et al. | 359/341 |
| 5,761,234 A | * | 6/1998 | Craig et al. | 372/75 |
| 5,801,858 A | | 9/1998 | Roberts et al. | 359/114 |
| 5,844,706 A | | 12/1998 | Kohn et al. | 359/179 |
| 5,847,862 A | | 12/1998 | Chraplyvy et al. | 359/337 |

* cited by examiner

Primary Examiner—Leon Scott, Jr.
(74) Attorney, Agent, or Firm—Allen, Dryer, Doppelt, Milbrath & Gilchrist, P.A.

(57) ABSTRACT

A laser driver circuit includes an injection laser diode. A current source control loop circuit is connected to the injection laser diode and establishes a fixed current through the injection laser diode. A voltage switcher circuit is connected to the injection laser diode and current source control loop circuit and adapted to receive a fixed supply voltage and convert inductively the supply voltage down to a forward voltage to bias the injection laser diode and produce an optical fiber coupled laser output having minimized power losses.

24 Claims, 5 Drawing Sheets

LOW POWER LASER DRIVER

FIELD OF THE INVENTION

This invention relates to laser drivers, and more particularly, this invention relates to laser drivers used for driving an optic preamplifier.

BACKGROUND OF THE INVENTION

The bandwidth of single channel (or wavelength) fiber optic telecommunication links is mainly limited by the high-speed electronics required at the transmitter and receiver. Wavelength division multiplexing of optical communication signals is a technique used for increasing the bandwidth of a fiber optic telecommunications link, without increasing the speed of the electronics. At the communications receiver, the optical channels that receive optical communication signals must be separated, or demultiplexed, and sent to their individual receivers, which vary in their rate of data receipt. One example is 2.488 Gb/s receivers.

The demultiplexing process is not ideal and optical losses are incurred, thus reducing the overall receiver sensitivity. A reduction in sensitivity also translates into shorter transmission lengths for the overall telecommunications link. When components are optimized on an individual basis, the benefits of any smaller size and lower power operation are not achieved with these type of receiver architectures. One current method of achieving high sensitivities in a wavelength division multiplexed receiver is the use of a wavelength demultiplexer with avalanche photodiodes (APD). These electronically amplified optical receivers have been designed as separate units in a rack-mounted configuration. Typically, each card unit within a rack-mounted configuration represents an individual component, forming a very large, but undesirable unit, especially in low power applications, as in advanced aircraft designs or other design specifications where low power and small footprint are desired.

Because these types of optical receivers are rack-mounted units and use avalanche photodiodes, the receiver sensitivity power penalty is incurred approximately equal to the optical insertion loss of the optical demultiplexer. Typically, telecommunications receivers using optical pre-amplification are not optimized for both high sensitivity and low power, and are not contained within a single assembly. Also, in some optical communication receivers, a laser driver may be necessary. To deliver the current necessary to power a laser diode, an electric circuit is used and supplies power to the laser driver, but also dissipates power of its own. This power, which is dissipated in the control circuit, is essentially wasted power, because it is not converted into photons.

Some current design injection laser diode drivers use a linear pass transistor to deliver a regulated current to the injection laser diode. This method results in a constant voltage across the device and constant current through the device, resulting in a large amount of dissipated power. For example, nearly 90% of all power dissipated by the injection laser diode driver occurs in the pass transistor, in some prior art designs. Thus, there is a necessary requirement and solution desired to deliver a clean current source to the injection laser diode.

SUMMARY OF THE INVENTION

The present invention is advantageous and provides a low power laser driver that drives an optically amplified preamplifier for low power applications, such as advanced commercial and military aircraft, where lightweight and low power are required.

In accordance with the present invention, the laser driver includes an injection laser diode and a current source control loop circuit connected to the injection laser diode for establishing a fixed current through the injection laser diode. A voltage switcher circuit is connected to the injection diode and current source control loop circuit. This voltage switcher circuit is adapted to receive a fixed supply voltage and convert inductively the supply voltage down to a forward voltage for biasing the laser diode and producing an optical output having minimized power losses.

A high efficiency current source is connected to the laser diode. The voltage switcher circuit is monolithically formed as a single circuit chip. The current source control loop circuit also includes a current source leg having at least one electronic component. This voltage switcher circuit has an output that is varied such that there is minimal voltage drop across the at least one component of the current source leg. In one aspect of the invention, the injection laser diode comprises a high quantum efficiency laser diode. The fixed supply voltage is about five volts as used with semiconductor technology.

The laser driver circuit formed by the injection laser diode, current source control loop circuit and voltage switcher circuit form an integrated laser driver that is received within a laser driver housing. In yet another aspect of the present invention, an external Bragg grating is operatively connected to the injection laser diode and receives the optical output and stabilizes the optical wavelength of the output. This external Bragg grating is used to eliminate a thermal electric cooler.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
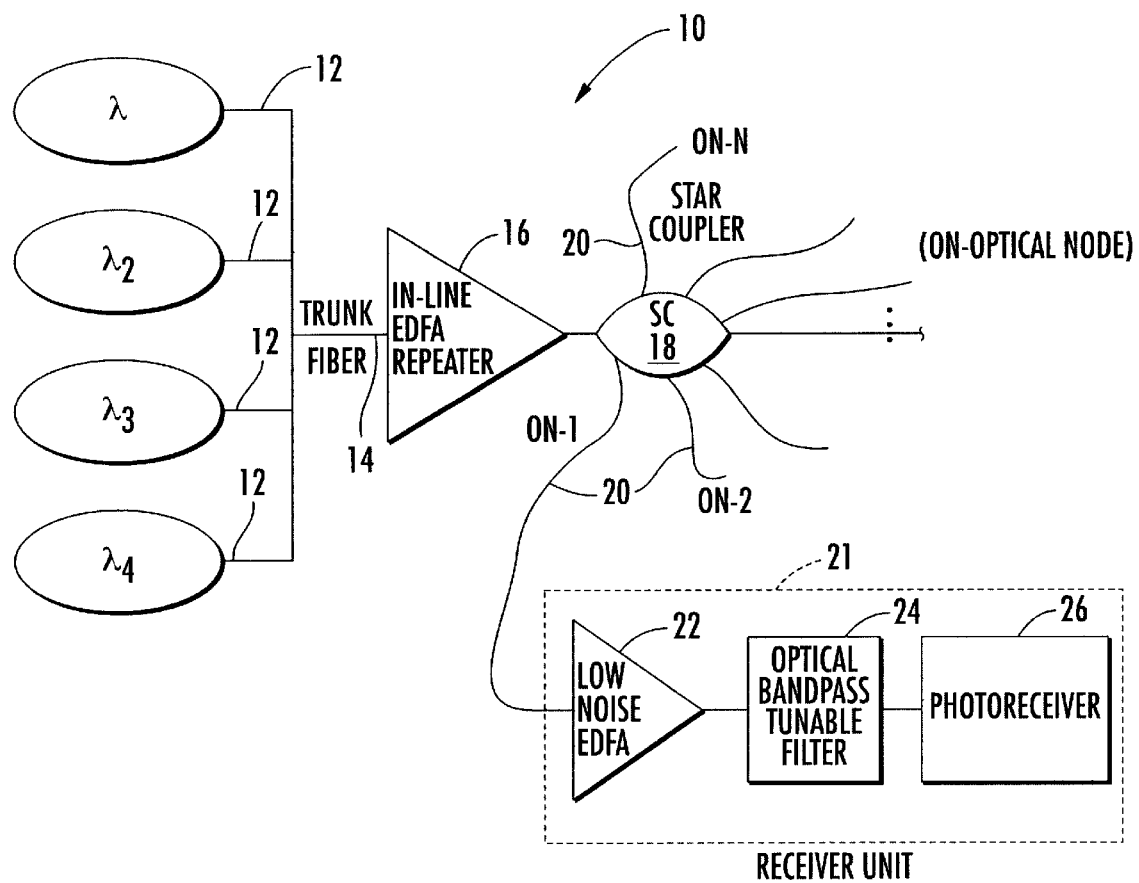
FIG. 1 is a high level diagram showing an example of a low-noise, wavelength division multiplexed receiver of the present invention, connected to a star coupler and in-line, erbium doped, fiber amplifier repeater.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention provides a highly engineered, optimized, and fully integrated, high sensitivity wavelength division demultiplexed optically amplified receiver that is designed to be used preferably with a single input fiber, having multiple wavelengths of communication signals. Also, the receiver allows significant power savings by using a laser driver that has reduced power over many current state-of-the-art continuous wave laser drivers.

This power savings is accomplished by using a standard current source control loop configuration that is set to the desired current through an injection laser diode. The current source has been optimized by using state-of-the-art components to minimize the amount of wasted power, i.e., power not delivered to the injection laser diode. The laser driver also has a current source that is a high efficiency variable voltage switcher having an output voltage that is varied, such that there is minimal voltage drop across each of the components in the current source leg, thus wasting no excess power. These power savings can be diverted to other circuits in the system, and can allow a battery powered device to last longer with increased financial and energy savings.

In one aspect of the present invention, a switching current source is used for driving the injection laser diode in the optic preamplifier such that inefficient linear drivers are replaced. The current injection laser diodes used in many prior art devices are inefficient and operate on the order of 300 mW, to deliver the optic power to an erbium-doped gain element.

Some injection laser diode drivers use a linear pass transistor to deliver the regulated current to the injection laser diode. This results in a constant voltage across and constant current through the device, resulting in a large amount of dissipated power, and in some instances, nearly 90% occurring at the pass transistor.

The present invention allows a clean current to be delivered to the injection laser diode from a switching pass transistor, which is alternatively operated in the "full on," then the "full off" mode. When in the "full on" mode, there is no voltage across the transistor. When in the "full off" mode, no current flows through the transistor. As a result, the switching pass transistor dissipates a reduced amount of power. By allocating the switcher operating parameters based on characteristics of the injection laser diode and the erbium gain element, the switcher noise is maintained in a manner consistent with the high performance of the optical amplifier. Expected efficiency improvements are reduction of the pass transistor power to approximately 15% of total driver power, and total net efficiencies, including the injection laser diode, in the range of up to about 30%. This allows additional fibers to be placed in cables.

The present invention also provides a wavelength division multiplexed and low power optically amplified receiver that is fully integrated and optimized with high sensitivity. It incorporates low power engineering and has a customized high efficiency pump laser driver as described before, and thermo-electric coolerless operation of the pump laser. It allows silicon based chip technology in the receiver. In one aspect of the invention, as a non-limiting example only, it is optimized and integrated for achieving high sensitivity in the form of eight different channels at 2.488 Gb/s channels based at 100 GHz (0.8 nM).

The receiver, in one aspect of the invention, uses a single input fiber with multiple wavelengths as described. It has a low noise, gain flattened erbium doped fiber amplifier that acts as a preamplifier, followed by a low loss demultiplexer with minimal variation in channel-to-channel output power. A receiver array then follows and includes in each receiver a PIN detector and high speed electronics.

As noted before, the bandwidth of a single channel or wavelength fiber optic telecommunication link is limited by the high-speed electronics required at the transmitter and receiver. Although various channel data rates are known, the present invention will be described relative to data rates of about 2.5 Gb/s. Naturally, the design can be used with increased data rates. Some state-of-the-art optical receivers for single channel fiber optic telecommunication links operate at 2.488 Gb/s, and are limited to operating at a bit/error ratio of $1 \times 10^{-11}$ at incident optical powers of −34 dBm. Wavelength division multiplexing (WDM) increases the bandwidth of a fiber optic telecommunications link without requiring an increase in the speed of electronics. This technique multiplexes multiple channels and wavelengths, each modulated at, as a non-limiting example, 2.488 Gb/s, onto a single fiber. This aggregate bit rate of the fiber now becomes N×2.488 Gb/s where N=2, 3, 4, . . . . At the receiver, the optical channels are separated and demultiplexed and sent to their individual 2.488 Gb/s receivers.

The demultiplexing process is not ideal and optical losses are incurred, thus reducing the overall receiver sensitivity. This translates to shorter transmission lengths. By incorporating the optic preamplifier based on the erbium doped fiber technology of the present invention, the demultiplexer losses are overcome and can increase the signal level well above the receiver noise floor and increase the receiver sensitivity. The erbium doped fiber amplifier technology allows the use of PIN detectors in place of avalanche photo diodes as an optical-to-electrical converter. By optimizing each of the individual components and incorporating them into a single unit, the invention not only increases transmission distances over currently available technology, but also reduces the volume of equipment-rack space.

Referring now to the drawing figures, a more detailed description of the invention follows.

FIG. 1 illustrates a wavelength division multiplexed optical network 10 where various signals λ1, λ2, λ3, λ4 come through a plurality of optical fiber channels 12 as fiber optic lines into a trunk optical fiber 14 and into an in-line erbium doped fiber amplifier repeater 16 to a star coupler 18. Different signal branches 20 (ON-1, . . . ON-N) extend from the star coupler 18, where one branch (or channel) is illustrated as having optical receiver 28, and a low noise erbium doped fiber amplifier 22 and an optical bandpass tunable filter 24 followed by a photo receiver 26, such as working at 2.5 Gb/s.

Figure 2:
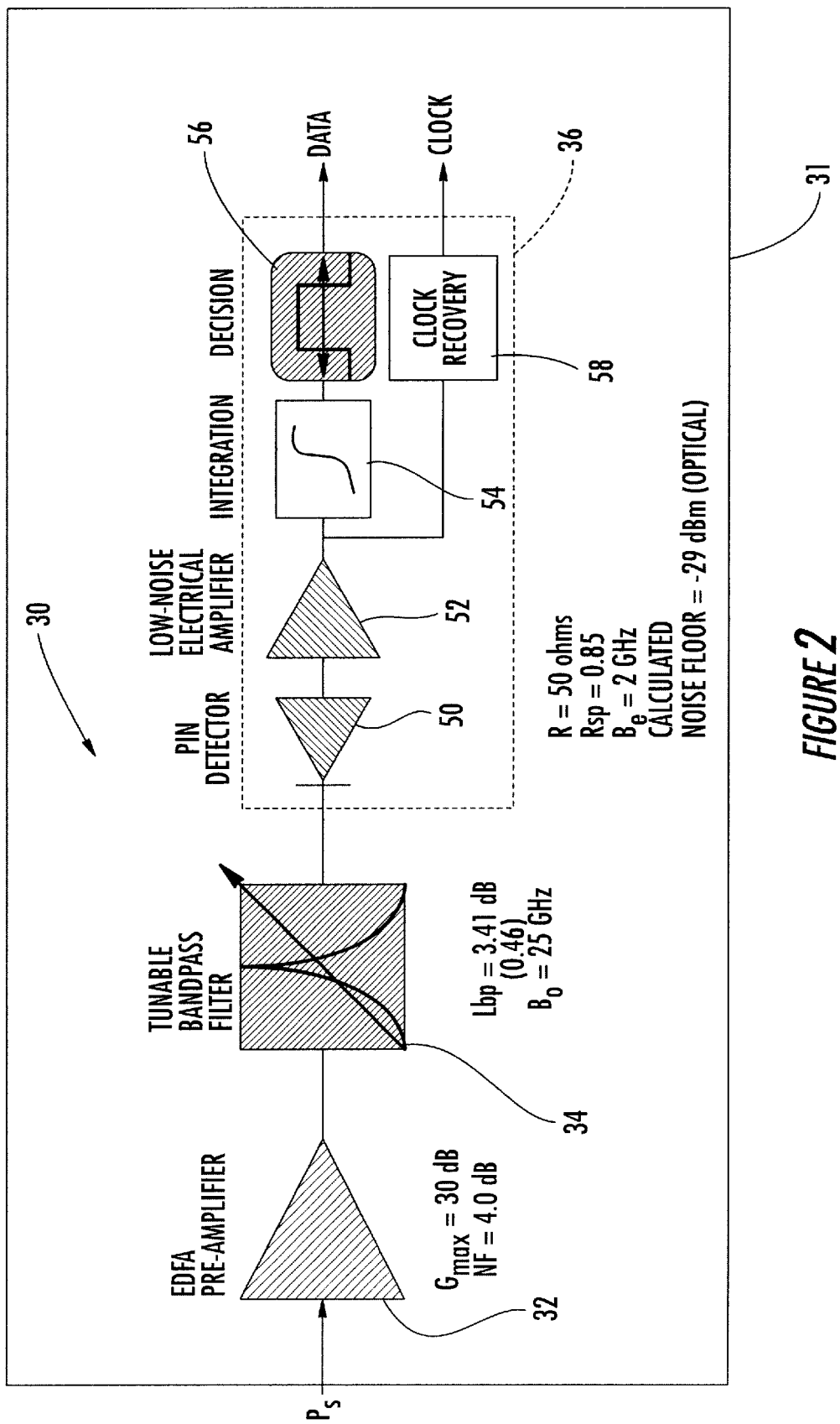
FIG. 2 is a block diagram of one example of an optically amplified receiver of the present invention.

FIG. 2 illustrates at 30 an optically amplified receiver of the present invention contained in housing, or in another aspect of the invention, on a printed circuit card assembly 31. In one aspect, components are mounted on a single printed circuit card assembly, which can be mounted in one housing, and forming an integral receiver assembly. Although the description will proceed relative to a description with non-limiting data rates of 2.5 Gb/s, it should be understood by all those skilled in the art that the invention can be applied to different data rates.

As shown in FIG. 2, the signal Ps enters the erbium doped fiber preamplifier 32, acting as an optical preamplifier. The relative operating parameters for the illustrated preamplifier 32, tunable bandpass filter circuit 34 and optical-to-electrical conversion circuit 36, are illustrated relative to the appropriate blocks. The bandpass filter receives the signal from the optical preamplifier, selects a single channel, and filters out noise produced by the optical preamplifier in a manner known to those skilled in the art.

Figure 4:
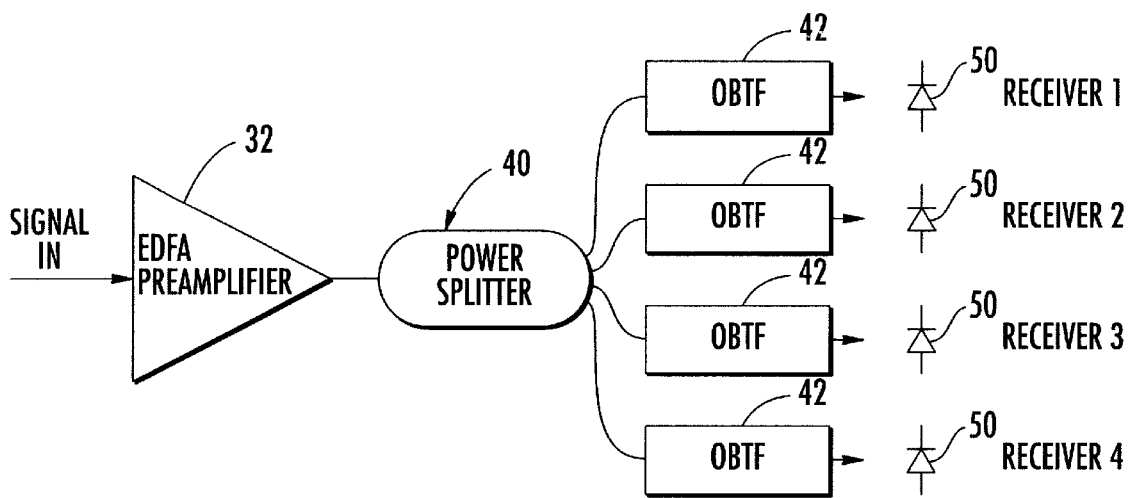
FIG. 4 is a block diagram showing an example of a power splitter/optical bandpass tunable filter, demultiplexer that can be used with the present invention.
Figure 5:
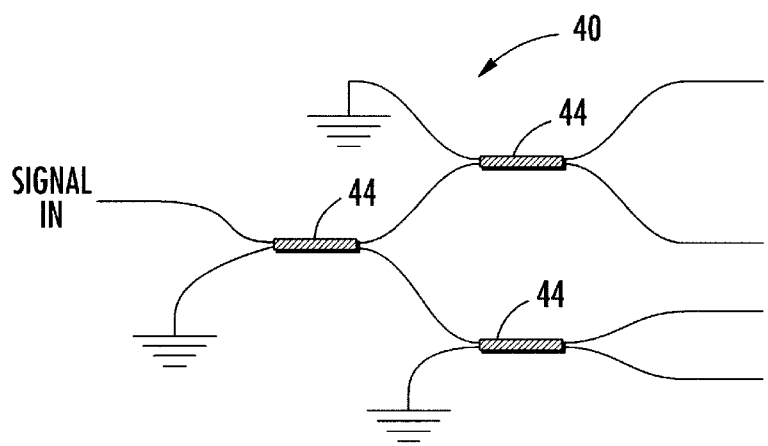
FIG. 5 is a schematic diagram of a power splitter that can be used with the present invention.
Figure 6:
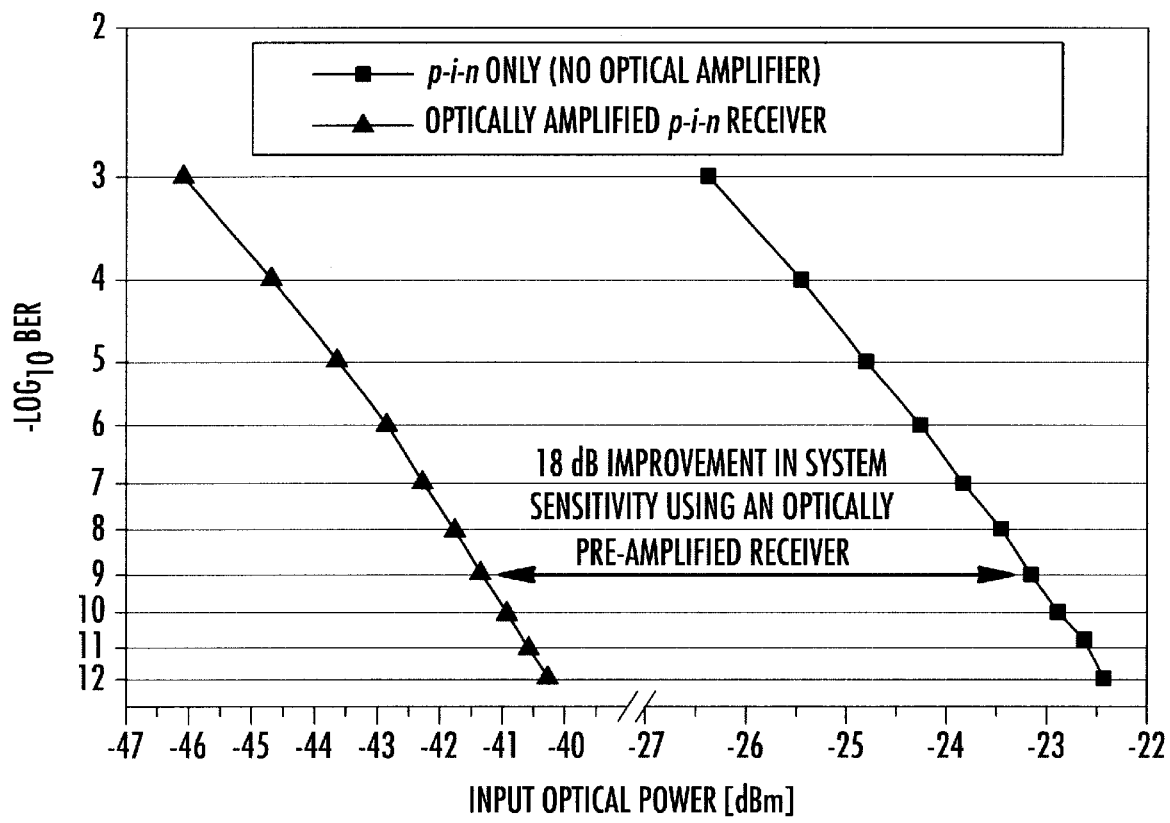
FIG. 6 is a graph showing the bit error rate versus input optical power in dBm, as an example of the present invention.

In one aspect of the invention, the tunable bandpass filter circuit 34 of the present invention includes a power splitter 40 and optical bandpass tunable filters 42, as shown in FIGS. 4 and 5, where the power splitter 40 is shown as cascaded 3-dB couplers 44. Although this illustrates only one type of power splitter/optical bandpass tunable filter and demultiplexer that can be used with the present invention, it should be understood that different types of circuits can be used with the present invention.

In one aspect of the present invention, the optical-to-electrical conversion circuit 36 includes a PIN detector (diode) 50, followed by a low-noise electrical amplifier 52. An electronic limiting amplifier 54 works in conjunction with decision circuit 56 and allows data recovery and reshapes electrical communication signals, while a clock recovery circuit 58 allows recovery of clock signals and retiming of electrical communication signals.

Figure 3:
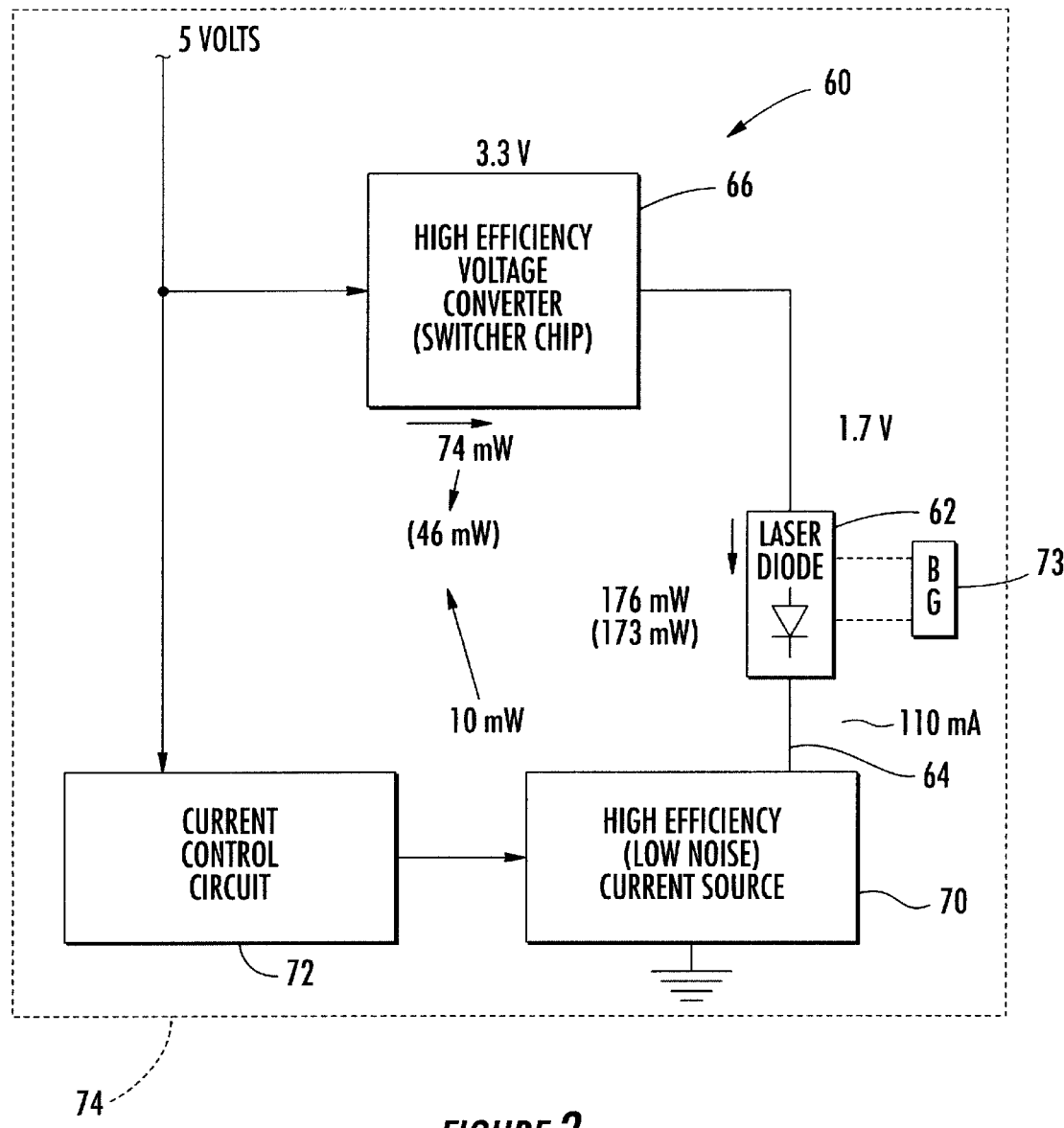
FIG. 3 is a block diagram showing an example of the laser driver/power converter of the present invention, which is used as part of the optically amplified receiver.

FIG. 3 illustrates the low power laser driver circuit 60 of the present invention, which is used for driving the optical preamplifier and receiver assembly. The five volt supply voltage input is standard with many electronic circuits. The laser driver circuit 60 includes an injection laser diode 62 that is, in one aspect of the present invention, a quantum efficiency injection laser diode (HQEILD). A current source control loop circuit 64 is connected to the injection laser diode 62 and establishes a fixed current through the injection laser diode. This current source control loop circuit 64 has a voltage switcher circuit chip 66 connected to the injection laser diode, within the current source control loop circuit, and is adapted to receive the fixed supply voltage of five volts and convert inductively the supply voltage down to a forward voltage, to bias the laser injection diode and produce an optical output having minimized power losses.

This voltage switcher circuit chip 66 is monolithically formed as a single circuit chip, and is used as a high efficiency voltage converter as shown in FIG. 3.

The current source control loop circuit 64 includes the high efficiency current source 70, acting as a low noise current source and the current control circuit 72. These circuits are all contained within one housing, and in one aspect, on a printed circuit card assembly 74 that includes the receiver components, including the preamplifier, tunable bandpass filter circuit and optical-to-electrical conversion circuit.

The schematic circuit diagram shows various power and voltage, as well as current parameters. In this non-limiting example, at 260 milliwatts and at five volts DC, there is a 35 decibel optical gain, with one channel as a design goal. There could be a 266 milliwatt DC for eight channels, and 220 milliwatts DC achieved. The Bragg grating 73 is operatively connected to the injection laser diode 62, and is operative by principles known to those skilled in the art. The Bragg grating 73 is configured for receiving the optical output and stabilizing the optical wavelength.

FIG. 5 illustrates a graph showing the log of base 10 for the bit error rate (BER) versus the input optical power (in dBm). The square dots represent a PIN only receiver, without optical amplifier, while the triangular dots represent the optically amplified PIN receiver of the present invention. There is illustrated on the graph an 18 decibel improvement in system sensitivity using the optically preamplified receiver of the present invention.

This application is related to copending patent applications entitled, "OPTICALLY AMPLIFIED RECEIVER" which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A laser driver comprising:

an injection laser diode;

a current source control loop circuit connected to said injection laser diode that establishes a fixed current through the injection laser diode; and a voltage switcher circuit connected to said injection diode and current source control loop circuit, said voltage switcher circuit adapted to receive a fixed supply voltage and convert inductively the supply voltage down to a forward voltage for biasing the laser diode and producing an optical fiber coupled laser output having minimized power losses.

2. A laser driver according to claim 1, and further comprising a high efficiency current source connected to said laser diode.

3. A laser driver according to claim 1, wherein said voltage switcher circuit is monolithically formed as a single circuit chip.

4. A laser driver according to claim 1, wherein said current source control loop circuit further comprises a current source leg having at least one component, wherein said voltage switcher circuit has an output that is varied such that there is minimal voltage drop across at least one component of said current source leg.

5. A laser driver according to claim 1, wherein said injection laser diode comprises a high quantum efficiency laser diode.

6. A laser driver according to claim 1, wherein said fixed supply voltage is about five volts.

7. An integrated laser driver comprising:

a housing;

a laser driver circuit mounted within said housing and comprising:

an injection laser diode;

a current source control loop circuit connected to said injection laser diode that establishes a fixed current through the injection laser diode; and a voltage switcher circuit connected to said injection diode and current source control loop circuit, said voltage switcher circuit adapted to receive a fixed supply voltage and convert inductively the supply voltage down to a forward voltage to bias the laser diode and produce an optical fiber coupled laser output having minimized power losses.

8. A laser driver according to claim 7, and further comprising a high efficiency current source connected to said laser diode.

9. A laser driver according to claim 7, wherein said voltage switcher circuit is monolithically formed as a single circuit chip.

10. A laser driver according to claim 7, wherein said current source control loop circuit further comprises a current source leg having at least one component, wherein said voltage switcher circuit has an output that is varied such that there is minimal voltage drop across at least one component of said current source leg.

11. A laser driver according to claim 7, wherein said injection laser diode comprises a high quantum efficiency laser diode.

12. A laser driver according to claim 7, wherein said fixed supply voltage is about five volts.

13. A laser driver comprising:

an injection laser diode;

a current source control loop circuit connected to said injection laser diode that establishes a fixed current through the injection laser diode;

a voltage switcher circuit connected to said injection diode and current source control loop circuit, said voltage switcher circuit adapted to receive a fixed supply voltage and convert inductively the supply voltage down to a forward voltage to bias the laser diode and produce an optical fiber coupled laser output having minimized power losses; and a Bragg grating operatively connected to said injection laser diode for receiving said optical output and stabilizing the optical wavelength.

14. A laser driver according to claim 13, and further comprising a high efficiency current source connected to said laser diode.

15. A laser driver according to claim 13, wherein said voltage switcher circuit is monolithically formed as a single circuit chip.

16. A laser driver according to claim 13, wherein said current source control loop circuit further comprises a current source leg having at least one electronic component, wherein said voltage switcher circuit has an output that is varied such that there is minimal voltage drop across said at least one electronic component of said current source leg.

17. A laser driver according to claim 13, wherein said injection laser diode comprises a high quantum efficiency laser diode.

18. A laser driver according to claim 13, wherein said fixed supply voltage is about five volts.

19. An integrated laser driver comprising:

a laser driver housing;

a laser driver circuit mounted within said laser driver housing and comprising:

an injection laser diode;

a current source control loop circuit connected to said injection laser diode that establishes a fixed current through the injection laser diode;

a voltage switcher circuit connected to said injection diode and current source control loop circuit, said voltage switcher circuit adapted to receive a fixed supply voltage and convert inductively the supply voltage down to a forward voltage to bias the laser diode and produce an optical fiber coupled laser output having minimized power losses; and a Bragg grating operatively connected to said injection laser diode for receiving said optical output and stabilizing the optical wavelength.

20. A laser driver according to claim 19, and further comprising a high efficiency current source connected to said laser diode.

21. A laser driver according to claim 19, wherein said voltage switcher circuit is monolithically formed as a single circuit chip.

22. A laser driver according to claim 19, wherein said current source control loop circuit further comprises a current source leg having at least one component, wherein said voltage switcher circuit has an output that is varied such that there is minimal voltage drop across said at least one component of said current source leg.

23. A laser driver according to claim 19, wherein said injection laser diode comprises a high quantum efficiency laser diode.

24. A laser driver according to claim 19, wherein said fixed supply voltage is about five volts.

* * * * *